United States Patent
Hirano et al.

(10) Patent No.: US 10,815,572 B2
(45) Date of Patent: Oct. 27, 2020

(54) CHEMICALLY AMPLIFIED POSITIVE RESIST COMPOSITION AND PATTERN FORMING PROCESS

(71) Applicant: SHIN-ETSU CHEMICAL CO., LTD., Tokyo (JP)

(72) Inventors: Yoshinori Hirano, Annaka (JP); Satoshi Asai, Annaka (JP); Katsuya Takemura, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 136 days.

(21) Appl. No.: 15/227,385

(22) Filed: Aug. 3, 2016

(65) Prior Publication Data

US 2017/0038684 A1 Feb. 9, 2017

(30) Foreign Application Priority Data

Aug. 4, 2015 (JP) ................................. 2015-154142
Jul. 15, 2016 (JP) ................................. 2016-139993

(51) Int. Cl.
- *C23C 18/16* (2006.01)
- *G03F 7/40* (2006.01)
- *C25D 5/02* (2006.01)
- *G03F 7/039* (2006.01)

(52) U.S. Cl.
CPC .......... *C23C 18/1605* (2013.01); *C25D 5/022* (2013.01); *G03F 7/0392* (2013.01); *G03F 7/405* (2013.01)

(58) Field of Classification Search
CPC .......... G03F 7/0395; G03F 7/405; G03F 7/32; G03F 7/38; G03F 7/2037; G03F 7/092; G03F 7/168; C25D 5/022; C23C 18/1605
See application file for complete search history.

(56) References Cited

U.S. PATENT DOCUMENTS

| | | | |
|---|---|---|---|
| 8,980,525 B2 | 3/2015 | Yasuda et al. | |
| 2005/0253119 A1* | 11/2005 | Araki | G03F 7/0007 252/582 |
| 2007/0065753 A1* | 3/2007 | Mizutani | G03F 7/0046 430/270.1 |
| 2007/0179309 A1* | 8/2007 | Hasegawa | C07C 29/147 560/227 |
| 2009/0029284 A1* | 1/2009 | Matsumaru | G03F 7/405 430/270.1 |
| 2013/0026044 A1* | 1/2013 | Yasuda | G03F 7/0392 205/136 |

FOREIGN PATENT DOCUMENTS

| | | |
|---|---|---|
| EP | 2 551 722 B1 | 1/2013 |
| JP | 2011-95662 A | 5/2011 |
| JP | 2013-47786 A | 3/2013 |
| JP | 5353639 B2 * | 11/2013 |

* cited by examiner

*Primary Examiner* — Louis J Rufo
(74) *Attorney, Agent, or Firm* — Westerman, Hattori, Daniels & Adrian, LLP

(57) ABSTRACT

A chemically amplified positive resist composition is provided comprising (A) a polymer adapted to tarn soluble in alkaline aqueous solution under the action, of acid, (B) a photoacid generator, (C) a car boxy lie acid, and (D) a benzotriazole compound and/or an imidazole compound. When the resist composition is coated on a copper substrate as a thick film of 5-250 μm thick and lithographically processed into a pattern, a high resolution is available and the pattern is of rectangular profile.

13 Claims, 1 Drawing Sheet

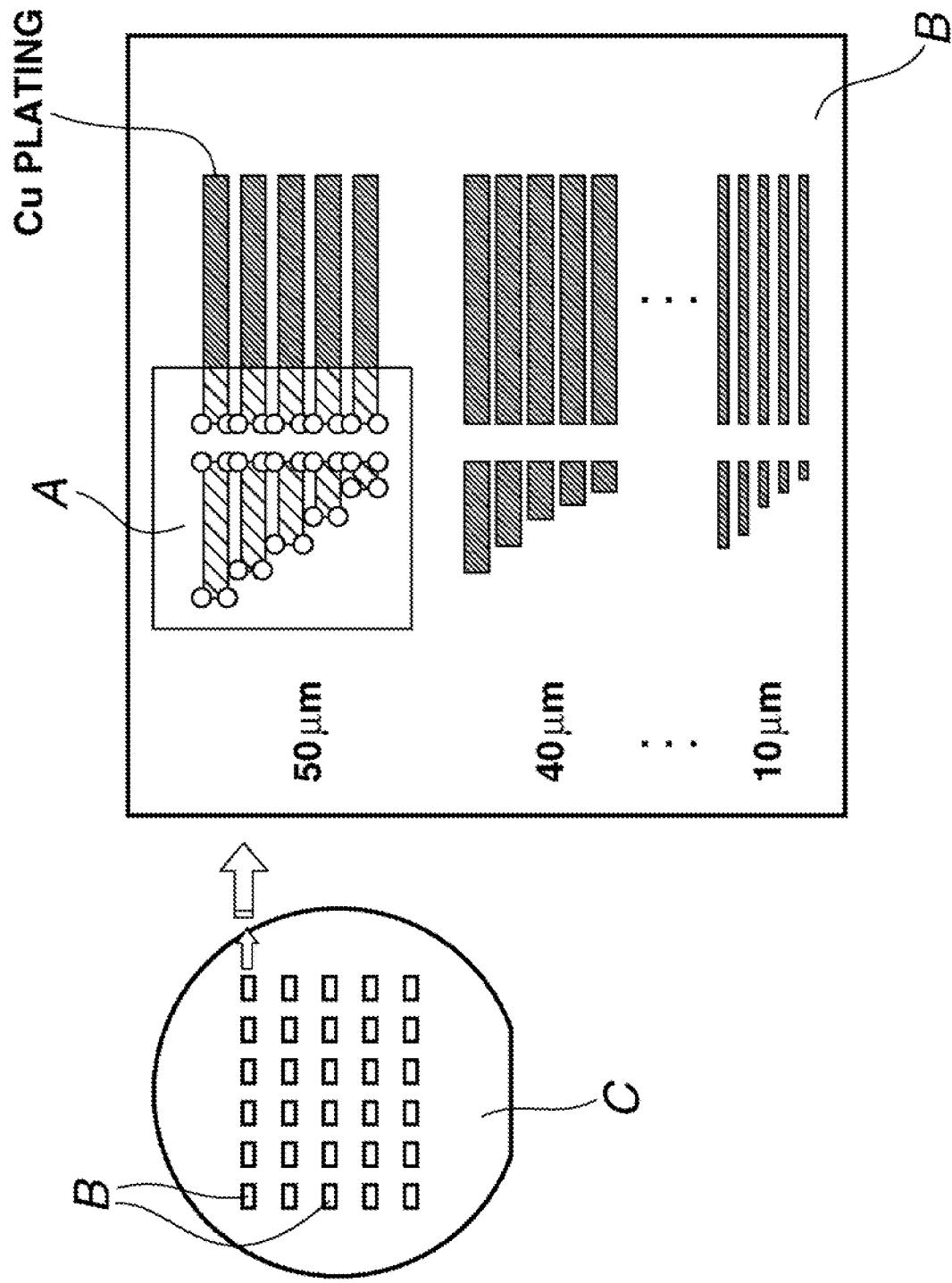

CHEMICALLY AMPLIFIED POSITIVE RESIST COMPOSITION AND PATTERN FORMING PROCESS

CROSS-REFERENCE TO RELATED APPLICATION

This non-provisional application claims priority under 35 U.S.C. § 119(a) on Patent Application No. 2015-154142 filed in Japan on Aug. 4, 2015 and 2016-139993 filed in Japan on Jul. 15, 2016, the entire contents of which are hereby incorporated by reference.

TECHNICAL FIELD

This invention relates to a chemically amplified positive resist composition and a pattern forming process.

BACKGROUND ART

While progress is now made toward microelectronic devices of higher integration density, multi-pin thin-layer packages are used. For the manufacture of multi-pin structures, the technology for forming bump electrodes with a height of 10 to 100 μm or more as the connecting terminal is necessary. When electrodes are formed by electroplating, a chemically amplified positive photoresist composition is often used because a high sensitivity and high resolution are rather readily achievable and stripping of a photoresist film after plating is easy. When a resist pattern is formed on a copper substrate, however, many resist materials give rise to the so-called footing phenomenon that a thin resist layer is left at the interface with the substrate. For example, Patent Document 1 discloses the addition of a benzotriazole compound to a resist material, which forms a pattern of improved profile on the Cu substrate. For the recognition of pattern profile, a resist film of 50 μm thick is processed into a line-and-space pattern with a size of 50 μm, which is observed. However, when the pattern size is reduced, for example, a line-and-space pattern with, a size of 30 μm is formed, the footing phenomenon occurs. There is the desire for a resist material having a higher resolution.

The technology of adding carboxylic acid to a chemically amplified positive photoresist composition to enhance its resolution is disclosed in Patent Document 2. In this patent document, evaluation is made on a film of 1 μm thick. However, when the thickness of film increases, specifically beyond 10 μm, the pattern on the Cu substrate can no longer be resolved.

A chemically amplified positive photoresist composition is long waited which even in a very thick film region of more than 10 μm, exhibits a resolution as demonstrated by an aspect ratio of at least 2 and gives rise to no footing phenomenon on a Cu substrate.

CITATION LIST

Patent Document 1: JP-A 2013-047786 (U.S. Pat. No. 8,980,525, EP 2551722)
Patent Document 2: JP-A 2011-095662

SUMMARY OF INVENTION

An object of the invention is to provide a chemically amplified positive resist composition which when a resist film with a thickness in excess of 10 μm is formed on a copper substrate and lithographically processed into a pattern, exhibits a high resolution as demonstrated by an aspect ratio of at least 2 and ensures to form a pattern of rectangular pro file.

The inventors have found that the above and other objects are achieved by a chemically amplified positive resist composition comprising a polymer adapted to turn soluble in alkaline aqueous solution as a result of an acid labile group being eliminated under acid catalysis, a photoacid generator, a carboxylic acid, and a benzotriazole compound and/or an imidazole compound.

In one aspect, the invention provides a chemically amplified positive resist composition comprising (A) a polymer adapted to turn soluble in alkaline aqueous solution under the action of acid, (B) a photoacid generator, (C) a carboxylic acid, and (D) at least one compound selected from (D-1) a benzotriazole compound and (D-2) an imidazole compound. The benzotriazole compound (D-1) has the general formula (1) or (3):

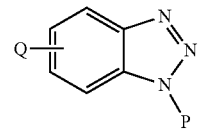

(1)

wherein P is hydrogen, hydroxyl, a substituted or unsubstituted $C_1$-$C_6$ alkyl, substituted or unsubstituted phenyl, substituent group having sulfonic acid or derivative thereof, or —Z—Y, wherein Z is a $C_2$-$C_{12}$ alkylene, cycloalkylene or alkylene ether group which may be substituted with carboxyl, Y is hydroxyl, $C_1$-$C_6$ alkoxy, carboxyl, or dialkylamino group in which each alkyl moiety is of $C_1$-$C_6$, Q is hydrogen, halogen, hydroxyl, $C_1$-$C_6$ alkyl, $C_1$-$C_6$ alkoxy, or an organic group of the formula (2):

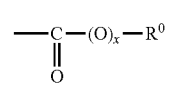

(2)

wherein $R^0$ is hydrogen or $C_1$-$C_{12}$ alkyl, x is 0 or 1,

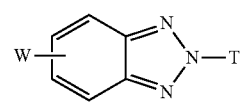

(3)

wherein T is hydrogen, hydroxyl, hydroxyl-substituted or unsubstituted $C_1$-$C_6$ alkyl or hydroxyl- or methyl-substituted or unsubstituted phenyl, W is hydrogen, halogen, hydroxyl; $C_1$-$C_6$ alkyl or $C_1$-$C_6$ alkoxy. The imidazole compound (D-2) has any one of the general formulae (I-1 to (I-6):

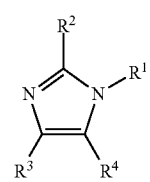

(I-1)

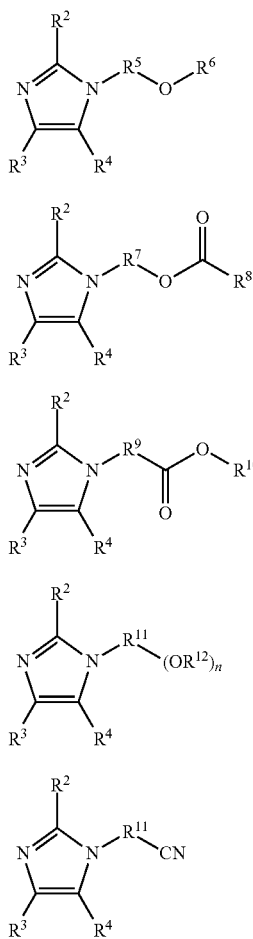

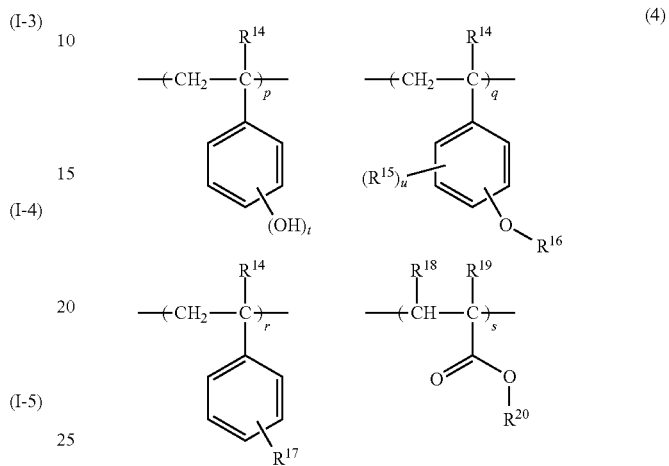

wherein $R^1$ is a straight, branched or cyclic $C_2$-$C_{20}$ alkyl group having a polar functional moiety, the polar functional moiety being at least one moiety selected from the group consisting of hydroxyl, carbonyl, ester, ether, sulfide, carbonate, cyano and acetal; $R^2$, $R^3$ and $R^4$ are each independently hydrogen, a straight, branched or cyclic $C_1$-$C_{10}$ alkyl, $C_6$-$C_{10}$ aryl or $C_7$-$C_{10}$ aralkyl group; $R^5$, $R^7$, $R^9$ and $R^{13}$ are each independently a straight, branched or cyclic $C_1$-$C_{10}$ alkylene group; $R^6$ and $R^8$ are each independently hydrogen or a $C_1$-$C_{15}$ alkyl group which may contain at least one moiety selected from the group consisting of hydroxyl, carbonyl, ester, ether, sulfide, carbonate, cyano and acetal; $R^{10}$ is a $C_1$-$C_{16}$ alkyl group which may contain at least one moiety selected from the group consisting of hydroxyl, carbonyl, ester, ether, sulfide, carbonate, cyano and acetal; $R^{11}$ is a (n+1)-valent, straight, branched or cyclic $C_2$-$C_{10}$ hydrocarbon group; $R^{12}$ is each independently hydrogen or a $C_1$-$C_{15}$ alkyl group which may contain at least, one moiety selected from the group consisting of hydroxyl, carbonyl, ester, ether, sulfide, carbonate, cyano and acetal, or two groups $R^{12}$ may bond together to form a ring, and n is 2, 3, 4 or 5.

Preferably, the carboxylic acid is at least one $C_1$-$C_{20}$ carboxylic acid selected from the group consisting of a saturated or unsaturated aliphatic carboxylic acid, alicyclic carboxylic acid, oxy carboxylic acid, alkoxy carboxylic acrid, ketco carboxylic acid, and aromatic carboxylic acid. More preferably, the carboxylic acid is a dicarboxylic acid. Most, preferably, the dicarboxylic acid is a dicarboxylic acid having a saturated aliphatic alkyl chain.

In a preferred embodiment, the polymer (A) comprises a polymer comprising recurring units represented by the general formula (4) and having a weight average molecular weight of 1,000 to 500,000.

Herein $R^{14}$ is each independently hydrogen, hydroxyl, straight alkyl, branched alkyl, halogen or trifluoromethyl, $R^{15}$ is each independently hydrogen, hydroxyl, halogen or trifluoromethyl, $R^{16}$ is $C_4$-$C_{12}$ tertiary alkyl, $R^{17}$ is hydrogen, optionally substituted alkyl, optionally substituted alkoxy, —$C(CF_3)_2$—OH. trialkylsiloxy group in which each alkyl moiety is of $C_1$-$C_6$, $C_4$-$C_{20}$ oxoalkoxy, tetrahydropyranyloxy, or tetrahydrofuranyloxy group, $R^{18}$ is hydrogen or methyl, $R^{15}$ is hydrogen, methyl, alkoxycarbonyl, cyano, halogen or trifluoromethyl, $R^{20}$ is a substituted or unsubstituted, straight or branched $C_4$-$C_{30}$ alkyl group or substituted or unsubstituted cycloalkyl group, u is an integer of 0 to 4, t is an integer of 0 to 5, p, r and s each are 0 or a positive number, q is a positive number, p+q+r+s= 1.

The resist composition may further comprise (E) an organic solvent.

In another aspect, the invention provides a dry film comprising a support film and a layer formed thereon from the chemically amplified positive resist composition defined above.

In a further aspect, the invention provides a pattern forming process comprising the steps of forming a coating of the chemically amplified positive resist composition or the layer of the chemically amplified positive resist composition on a substrate, optionally prebaking, exposing the coating or layer to radiation or electron beam through a photomask, optionally baking, and developing in a developer.

In a preferred embodiment, the step of exposing the coating or layer to radiation uses radiation with a wavelength of longer than 300 nm.

The process may further comprise the step of forming a metal plating on the substrate by electroplating or electroless plating, subsequent to the developing step.

Advantageous Effects of Invention

When the chemically amplified positive resist composition of the invention is coated on a substrate, especially copper substrate as a thick film of 5 to 250 μm thick, especially 10 to 150 μm thick and lithographically processed into a pattern, a high resolution as demonstrated by an aspect ratio of at least 2 is available and the pattern is improved in shape in proximity to the substrate, that is, of rectangular profile.

BRIEF DESCRIPTION OF DRAWINGS

FIG. 1 illustrates resist patterns, depicting an area where cracks are observed.

DESCRIPTION OF EMBODIMENTS

The terns "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group. As employed herein, the terminology "(meth)acrylic" or "(meth)acrylate" is intended to mean "acrylic or methacrylic" or "acrylate or methacrylate."

The abbreviations and acronyms have the following meaning.

UV: ultraviolet radiation
EB: electron team
Mw: weight average molecular weight
Mn: number average molecular weight
Mw/Mn: molecular weight distribution or dispersity
GPC: gel permeation chromatography
PEB: post-exposure baking In the chemically amplified positive resist composition of the invention, component (A) is a polymer adapted to turn soluble in alkaline aqueous solution under the action of acid. The polymer is not particularly limited as long as it possesses an acid-dissociatable dissolution inhibiting group which has been modified so as to inhibit dissolution in alkaline aqueous solution, and which has a functional group that, is turned into a hydroxyl and/or carboxyl group under the action of acid. Depending on a procedure taken after pattern formation, a polymer having necessary properties may be selected. For example, when pattern formation is followed by solder plating, which uses a strong acidic electrolytic bath, a polymer having acid resistance is preferred. Specifically, a polymer comprising recurring units represented by the general formula (4) and having a weight average molecular weight of 1,000 to 500,000 is preferred.

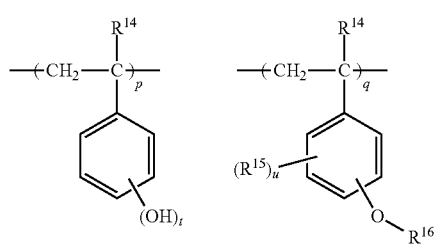

(4)

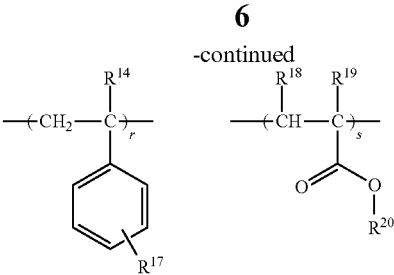

Herein $R^{14}$ is hydrogen, hydroxyl, straight $C_1$-$C_6$ alkyl, branched $C_3$-$C_6$ alkyl, halogen or trifluoromethyl, $R^{15}$ is hydrogen, hydroxyl, halogen or trifluoromethyl, $R^{16}$ is $C_4$-$C_{12}$ tertiary alkyl, $R^{17}$ is hydrogen, an optionally fluoro-substituted $C_1$-$C_{12}$ alkyl group, optionally fluoro-substituted $C_1$-$C_{12}$ alkoxy group, —C(CF$_3$)$_2$—OH, trialkylsiloxy group in which each alkyl moiety has 1 to 6 carbon atoms, $C_4$-$C_{20}$ oxoalkoxy group, tetrahydropyranyloxy group, or tetrahydrofuranyloxy group, $R^{18}$ is hydrogen or methyl, $R^{19}$ is hydrogen, methyl, alkoxycarbonyl, cyano, halogen or trifluoromethyl, $R^{20}$ is a substituted or unsubstituted, straight or branched $C_4$-$C_{30}$ alkyl or substituted or unsubstituted $C_4$-$C_{30}$ cycloalkyl group, u is 0 or an integer of 1 to 4, t is 0 or an integer of 1 to 5, p, r and s each are 0 or a positive number, q is a positive number, and p+q+r+s=1.

When the optionally substituted alkoxy group represented by $R^{17}$ has an acid labile group function, it is selected from a variety of such groups, preferably from a group of the following formula (5), a group of the following formula (6), and a straight, branched or cyclic $C_4$-$C_{20}$ tertiary alkoxy group. When $R^{17}$ is a tertiary alkoxy group, it is an alkoxy group excluding the tertiary alkyl group selected for $R^{16}$.

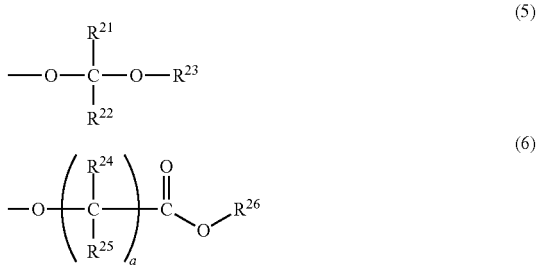

Herein $R^{21}$, $R^{22}$, $R^{23}$, $R^{24}$, and $R^{25}$ are each independently hydrogen, or a straight or branched $C_1$-$C_8$ alkyl group, a pair of $R^{21}$ and $R^{27}$, $R^{21}$ and $R^{23}$, or $R^{22}$ and $R^{23}$ may bond together to form a ring with the carbon atom or the carbon and oxygen atoms to which they are attached, each of $R^{21}$, $R^{22}$, and $R^{23}$ is a straight or branched $C_1$$C_{15}$ alkylene group when they form a ring, $R^{26}$ is a straight, branched or cyclic $C_4$-$C_{40}$ alkyl group, and a is 0 or an integer of 1 to 4.

Suitable acid labile groups of formula (5) include methoxyethyloxy, ethoxyethyloxy, n-propoxyethyloxy, isopropoxyethyloxy, n-butoxyethyloxy, isobutoxyethyloxy, t-butoxyethyloxy, cyclohexyloxyethyloxy, methoxypropyloxy, ethoxypropyloxy, 1-isothoxy-1-methylethyloxy, and 1-ethoxy-1-methylethyloxy. Suitable acid labile groups of formula (6) include t-butoxycarbonyloxy, t-butoxycarbonylmethyoxy, ethyleyelopentyloxycarbonyloxy, ethylcyclohexyloxycarbonyloxy, and methylcyclopentyloxycarbonyloxy, to be bonded to the benzene ring on a side chain in formula (4). Suitable trialkylsilyl groups include those in which each alkyl moiety has 1 to 6 carbon atoms, such as trimethylsilyl.

In formula (4), $R^{14}$, $R^{15}$ and $R^{19}$ may be halogen. Exemplary halogens are fluorine, chlorine and bromine.

$R^{20}$ is an alkyl group which may be tertiary alkyl Tertiary alkyl may be selected from optionally substituted alkyl groups of 4 to 30 carbon atoms, preferably those of the general formulae (7) and (8).

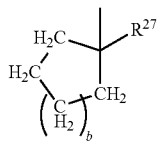

(7)

Herein $R^{27}$ is methyl, ethyl, isopropyl, cyclohexyl, cyclopentyl, vinyl, acetyl, phenyl, benzyl or cyano, and b is an integer of 0 to 3.

The cyclic alkyl groups of formula (7) are preferably 5- or 6-membered rings. Examples include 1-methylcyclopentyl, 1-ethylcyclopentyl, 1-isopropylcyclopentyl, 1-vinylcyclopentyl, 1-acetyleyelopentyl, 1-phenyleyelopentyl, 1-cyanocyc1opentyl, 1-methyleyelohexyl, 1-ethylcyclohexyl, 1-isopropylcyclohexyl, 1-vinylcyclohexyl, 1-acetylcyclohexyl, 1-phenylcyclohexyl, and 1-cyanoeyelohexyl.

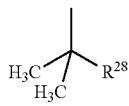

(8)

Herein $R^{28}$ is methyl, ethyl, isopropyl, cyclohexyl, cyclopentyl, vinyl, phenyl, benzyl or cryano.

Examples of the group of formula (8) include t-butyl, 1-vinyldimethylmethyl, 1-benzyldimethylmethyl, 1-phenyldimethylmethyl, and 1-cyanodimethylmethyl.

An alkyl group forming a tertiary ester as shown below is also preferred as $R^{20}$.

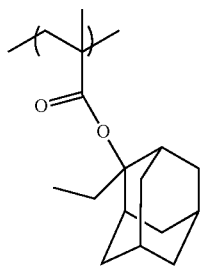

(9)-1

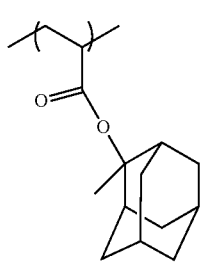

(9)-2

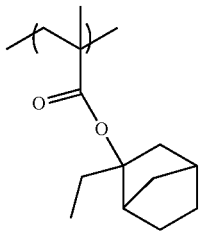

(9)-3

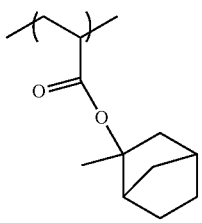

(9)-4

In formula (4), p, r and s each are 0 or a positive number, and q is a positive number. With properties of the resist composition taken into account, these subscripts preferably satisfy the following range:
$0<q/(p+q+r+s)\leq0.5$, more preferably $0<q/(p+q+r+s)\leq0.3$,
$0\leq p/(p+q+r+s)\leq0.8$, more preferably $0.3\leq p/(p+q+r+s)\leq0.8$,
$0\leq r/(p+q+r+s)\leq0.35$, with the proviso that $r>0$ when the polymer consists of four components,
$0\leq s/(p+q+r+s)\leq0.35$, more preferably $0<s/(p+q+r+s)<0.3$, provided $p+q+r+s=1$.

In case q=Q, indicating that a polymer of formula (4) does not contain the relevant unit (q), a contrast of alkali dissolution rate is lost, and resolution is worsened. If a proportion of p is too high, the unexposed region of film may have too high an alkali dissolution rate. By properly selecting the values of p, q, r and s within the above ranges, the size and profile of a pattern can be controlled as desired.

In order that the resist composition have a high sensitivity and be developable within a short time, it is preferred that s in formula (4) be not equal to 0. In a case where a phenolic hydroxyl group is protected with an acid labile group, the alkali soluble functional group resulting from elimination of that acid labile group is the phenolic hydroxyl group. On the other hand, the substituent group $R^{20}$ in recurring unit (s) is a tertiary alkyl group which is an acid labile group, and the alkali soluble functional group resulting from elimination of $R^{20}$ is —COOH group. When the dissolution rate of phenolic hydroxyl group and —COOH group in alkaline developer is compared, the dissolution rate of —COOH group is overwhelmingly high. Then the resist composition comprising a base resin containing recurring, units (s) has a high sensitivity and is developable within a short time.

The polymer should have a weight average molecular weight (Mw) of 1,000 to 500,000, preferably 2,000 to 30,000, as measured by GPC versus polystyrene standards using tetrahydrofuran (THF) as a solvent. With too low a Mw, the resist composition is less heat resistant. With too high a Mw, the resist composition is reduced in alkali dissolution and tends to a footing phenomenon after pattern formation.

The PAG (B) may be any compound capable of generating an acid upon exposure to high-energy radiation. Suitable PAGs include sulfonium salt, iodonium salt, sulfonyldiazoraethane, and N-sulfonyloxyimide acid generators. Exemplary acid generators are given below while they may be used alone or in admixture of two or more.

Sulfonium salts are salts of sulfonium cations with sulfonates. Exemplary sulfonium cations include triphenylsulfonium, (4-t-butoxyphenyl)diphenylsulfonium,
bis(4-t-butoxyphenyl)phenylsulfonium,
tris(4-t-butoxyphenyl)sulfonium,
(3-t-butoxyphenyl)diphenylsulfonium,
bis(3-t-butoxyphenyl)phenylsulfonium,
tris(3-t-butoxyphenyl)sulfonium,
(3,4-di-t-butoxyphenyl)diphenylsulfonium,
bis(3,4-di-t-butoxyphenyl)phenylsulfonium,
tris(3,4-di-t-butoxyphenyl)sulfonium,
diphenyl(4-thiophenoxyphenyl)sulfonium,
(4-t-butoxycarbonylmethyloxyphenyl)diphenylsulfonium,
tris(4-t-butoxcycarbonylmethyloxyphenyl)sulfonium,
(4-t-butoxyphenyl)bis(4-dimethylaminophenyl)sulfonium,
tris(4-dimethylaminophenyl)sulfonium,
2-naphthyldiphenylsulfonium, dimethyl(2-naphthyl)sulfonium,
4-hydroxyphenyldimethylsulfonium,
4-methoxyphenyldimethylsulfonium, trimethylsulfonium,
2-oxocyclohexylcyclohexylmethylsulfonium,
trinaphthylsulfonium, and tribenzylsulfonium,
Exemplary sulfonates include trifluoromethanesulfonate, nonafluorobutanesulfonate, heptadecafluorooctanesulfonate, 2,2,2-trifluoroethanesufonate, pentafluorobenzenesulfonate, 4-(trifluoromethyl)benzenesulfonate, 4-fluorobenzenesulfonate, toluenesulfonate, benzenesulfonate,
4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations include aryl iodonium cations such as diphenyliodonium, bis(4-t-butylphenyl)iodonium, 4-t-butoxyphenylphenyliodonium, and 4-methoxyphenylphenyliodonium. Exemplary sulfonates include trifluoromethanesulfonate, nonafluorobutanesulfonate, heptadecafluorooctanesulfonate,
2,2,2-trifluoroethanesulfonate, pentafluorobenzenesulfonate, 4-(trifluoromethyl)benzenesulfonate, 4-fluorobenzenesulfonate, toluenesulfonate, benzenesulfonate,
4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and
sulfonyl-carbonyldiazomethane compounds such as
bis(ethylsulfonyl)diazomethane,
bis(1-methylpropylsulfonyl)diazomethane,
bis(2-methylpropylsulfonyl)diazomethane,
bis(1,1-dimethylethylsulfonyl)diazomethane,
bis(cyclohexylsulfonyl)diazomethane,
bis(perfluoroisopropylsulfonyl)diazomethane,
bis(phenylsulfonyl)diazomethane,
bis(4-methylphenylsulfonyl)diazomethane,
bis(2,4-dimethylphenylsulfonyl)diazomethane,
bis(2-naphthylsulfonyl)diazomethane,
4-methylphenylsulfonylbenzoyldiazomethane,
t-butylcarbonyl-4-methylphenylsulfonyldiazomethane,
2-naphthylsulfonylbenzoyldiazomethane,
4-methylphenylsulfonyl-2-naphthoyldiazomethane,
methylsulfonylbenzoyldiazomethane, and
t-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2, 3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin, butanesulfonate.

Pyrogallol trisulfonate photoacid generators include pyrogallol, phloroglucinol, catechol, resorcinol, and hydroquinone, in which all hydroxyl groups are substituted by trifluoromethanesulfonate, nonafluorobutanesulfonate, heptadecafluorooctanesulfonate,
2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate,
nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonte, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl) propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Suitable O-arylsulfonyloxime compounds and O-alkylsulfonyloxime compounds (oxime sulfonates) include photoacid generators in the form of glyoxiiae derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Photoacid generators in the form of glyoxime derivatives include bis-O-(p-toluenesulfonyl)-α-dimethylglyoxime,
bis-O-(p-toluenesulfonyl)-α-diphenylglyoxime,
bis-O-(p-toluenesulfonyl)-α-dicyclahexylglyoxime,
bis-O-(p-toluenesulfonyl)-2,3-pentanedionedioxime,
bis-O-(n-butanesulfonyl)-α-dimethylglyoxime,
bis-O-(n-butanesulfonyl)-α-diphehylglyoxime,
bis-O-(n-butanesulfonyl)-α-dicyclohexylglyoxime, bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(4-fluorobenzenesulfonyl)-α-dimethylglyoxime,
bis-O-(4-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(4-fluorobenzenesulfonyl)-nioxime,
bis-O-(4-(trifluoromethyl)benzenesulfonyl)-nioxime, and
bis-O-(xylenesulfonyl)-nioxime.
Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethane sulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.
Photoacid generators in the form of oxime sulfonates with a long conjugated system separated by thiophene or cyclohexadiene include
(5-(p-toluenesulfonyl)oxyimino-5H-thiophen-2-ylidene)-phenylacetonitrile,
(5-(10-camphorsulfonyl)oxyimino-5H-thiophen-2-ylidene)-phenylacetonitrile,
(5-n-octanesulfonyloxyimino-5H-thiophen-2-ylidene)-phenylacetonitrile,
(5-(p-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile,
(5-(4-(p-toluenesulfonyloxy)benzenesulfonyl)oxyimino-5H-thiophen-2-ylidene)phenylacetonitrile, and
(5-(2,5-bis(p-toluenesulfonyloxy)benzenesulfonyl)oxyimino-5H-thiophen-2-ylidene)phenylacetonitrile.
Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyioxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adaisantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate, methoxycarbonyldifluoromethanesulfonate,
1-(hexahydro-2-oxo-3,5-methano-2H-cycrlopenta[b]furan-6-yl-oxycaxbonyl)difluorontethanesulfonate, and
4-oxo-1-adamantyloxycarbonyldifluoromethanesulfonate.
Suitable oxime sulfonates having an electron withdrawing group such as trifluororaethyl incorporated for increased stability include
2,2,2-trifluoro-1-phenyl-ethanone O-(methylsulfonyl)oxime,
2,2,2-trifluoro-1-phenyl-ethanone O-(10-camphorsulfonyl)oxime,
2,2,2-trifluoro-1-phenylethanone O-(4-methoxyberizenesulfonyl)oxime,
2,2,2-trifluoro-1-phenylethanone O-(1-naphthylsulfonyl)oxime,
2,2,2-trifluoro-1-phenylethanone O-(2-naphthylsulfonyl)oxime,
2,2,2-trifluoro-1-phenylethanone O-(2,4,6-trimethylphenylsulfonyl)oxime,
2,2,2-trifluoro-1-(4-methylphenyl)ethanone O-(10-camphorsulfonyl)oxime,
2,2,2-trifluoro-1-(4-dimethylphenyl)ethanone O-(methylsulfonyl)oxime,
2,2,2-trifluoro-1-(2-methylphenyl)ethanone O-(10-camphorsulfonyl)oxime,
2,2,2-trifluoro-1-(2,4-dimethylphenyl)ethanone O-(10-camphorsulfonyl)oxime,
2,2,2-trifluoro-1-(2,4-dimethylphenyl)ethanone O-(1-naphthylsulfonyl)oxime,
2,2,2-trifluoro-1-(2,4-dimethylphenyl)-ethanone O-(2-naphthylsulfonyl)oxime,
2,2,2-trifluoro-1-(2,4,6-trimethylphenyl)ethanone O-(10-camphorsulfonyl)oxime,
2,2,2-trifluoro-1-(2,4,6-trimethylphenyl)ethanone O-(1-naphthylsulfonyl)oxime,
2,2,2-trifluoro-1-(2,4,6-trimethylphenyl)ethanone O-(2-naphthylsulfonyl)oxime,
2,2,2-trifluoro-1-(4-methoxyphenyl)ethanone O-(methylsulfonyl)oxime,
2,2,2-trifluoro-1-(4-methylthiophenyl)-ethanone O-(methylsulfonyl)oxime,
2,2,2-trifluoro-1-(3,4-dimethoxyphenyl)ethanone O-(methylsulfonyl)oxime,
2,2,2-trifluoro-1-(4-methoxyphenyl)ethanone O-(4-methylphenylsulfonyl)oxime,
2,2,2-trifluoro-1-(4-methoxyphenyl)ethanone O-(4-methoxyphenylsulfonyl)oxime,
2,2,2-trifluoro-1-(4-methoxyphenyl)ethanone O-(4-dodeoylphenylsulfonyl)oxime,
2,2,2-trifluoro-1-(4-methoxyphenyl)ethanone O-(octylsulfonyl)oxime, 2,2,2-trifluoro-1-(4-thiomethylphenyl)ethanone O-(4-methoxyphenylsulfonyl)oxime,
2,2,2-trifluoro-1-(4-thiomethylphenyl)ethanone O-(4-dodecylphenylsulfonyl)oxime,
2,2,2-trifluoro-1-(4-thiomethylphenyl)ethanone O-(octylsulfonyl)oxime,
2,2,2-trifluoro-1-(4-thiomethylphenyl)ethanone O-(2-naphthylsulfonyl)oxime,
2,2,2-trifluoro-1-(2-methylphenyl)ethanone O-(methylsulfonyl)oxime,
2,2,2-trifluoro-1-(4-methylphenyl)ethanone O-(phenylsulfonyl)oxime,
2,2,2-trifluoro-1-(4-chlorophenyl)ethanone O-(phenylsulfonyl)oxime,
2,2,3,3,4,4,4-heptafluoro-1-phenylbutanone O-(10-camphorsulfonyl)oxime,
2,2,2-trifluoro-1-(1-naphthyl)ethanone O-(methylsulfonyl)oxime,
2,2,2-trifluoro-1-(2-naphthyl)ethanone O-(methylsulfonyl)oxime,
2,2,2-trifluoro-1-(4-benzylphenyl)ethanone O-(methylsulfonyl)oxime,
2,2,2-trifluoro-1-(4-(phenyl-1,4-dioxa-but-1-yl)phenyl)-ethanone O-(methylsulfonyl)oxime,
2,2,-trifluoro-1-(1-naphthyl)ethanone O-(propylsulfonyl)oxime,
2,2,2-trifluoro-1-(2-naphthyl)ethanone O-(propylsulfonyl)oxime,
2,2,2-trifluoro-1-(4-benzylphenyl)ethanone O-(propylsulfonyl)-oxime,
2,2,2-trifluoro-1-(4-methylsulfonylphenyl)ethanone O-(propylsulfonyl)oxime,
2,2,2-trifluoro-1-(4-methylsulfonyloxyphenyl)ethanone O-(propylsulfonyl)oxime,
2,2,2-trifluoro-1-(4-methylcarbonyloxyphenyl)ethanone O-(propylsulfonyl)oxime,
2,2,2-trifluoro-1-(6H,7H-5,8-dioxonaphth-2-yl)ethanone O-(propylsulfonyl)oxime,
2,2,2-trifluoro-1-(4-methoxycarbonylmethoxyphenyl)ethanone O-(propylsulfonyl)oxime,
2,2,2-trifluoro-1-(4-methoxycarbonyl)-(4-amino-1-oxapent-1-yl)phenyl)ethanone O-(propylsulfonyl)oxime,
2,2,2-trifluoro-1-(3,5-dimethyl-4-ethoxyphenyl)ethanone O-(propylsulfonyl)oxime,
2,2,2-trifluoro-1-(4-benzyloxyphenyl)ethanone O-(propylsulfonyl)oxime,
2,2,2-trifluoro-1-(2-thiophenyl)ethanone O-(propylsulfonate)-oxime, and
2,2,2-trifluoro-1-(1-dioxathiophen-2-yl)ethanone O-(propylsulfonate)oxime;
2,2,2-trifluoro-1-(4-(3-(4-(2,2,2-trifluoro-1-(trifluoromethanesulfonyloxyimino)ethyl)phenoxy)propoxy)phenyl)ethanone O-(trifluoromethanesulfonyl)oxime,
2,2,2-trifluoro-1-(4-(3-(4-(2,2,2-trifluoro-1-(1-propane-sulfonyloxyimino)ethyl)phenoxy)propoxy)phenyl)ethanone O-(propylsulfonyl)oxime,
2,2,2-trifluoro-1-(4-(3-(4-(2,2,2-trifluoro-1-(1-butane-sulfonyloxyimino)ethyl)phenoxy)propoxy)phenyl)ethanone O-(butylsulfonyl)oxime,
2,2,2-trifluoro-1-(4-(3-(4-(2,2,2-trifluoro-1-(4-(4-methylphenylsulfonyloxy)phenylsulfonyloxyimino)ethy)phenoxy)-propoxy)phenyl)ethanone O-(4-(4-methylphenylsulfonyloxy)-phenylsulfonyl)oxime, and
2,2,2-trifluoro-1-(4-(3-(4-(2,2,2-trifluoro-1-(2,5-bis(4-methylphenylsulfonyloxy)benzenesulfonyloxy)phenylsulfonyloxyimino)ethyl)phenoxy)propoxy)phenyl)ethanone O-(2,5-bis(4-methylphenylsulfonyloxy)benzenesulfonyloxy)phenylsulfonyl)-oxime.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Also included are oxime sulfonates having the formula (Ox-1):

wherein $R^{200}$ is a substituted or unsubstituted $C_1$-$C_{10}$ haloalkylsulfonyl or halobenzenesulfonyl group, $R^{201}$ is a $C_1$-$C_{11}$ haloalkyl group, and $R^{202}$ is a substituted or unsubstituted aromatic or hetero-aromatic group.
Examples include:
2-[2,2,3,3,4,4,5,5-octafluoro-1-(nonafluorobutylsulfonyl-oxyimino)-pentyl]fluorene,
2-[2,2,3,3,4,4-pentafluoro-1-(nonafluorobutylsulfonyl-oxyimino)-butyl]fluorene,
2-[2,2,3,3,4,4,5,5,6,6-decafluoro-1-(nonafluorobutylsulfonyl-oxyimino)-hexyl]fluorene,
2-[2,2,3,3,4,4,5,5-octafluoro-1-(nonafluorobutylsulfonyl-oxyimino)-pentyl]-4-biphenyl,
2-[2,2,3,3,4,4-pentafluoro-1-(nonafluorobutylsulfonyl-oxyimino)-butyl]-4-biphenyl, and
2-[2,2,3,3,4,4,5,5,6,6-decafluoro-1-(nonafluorobutylsulfonyl-oxyimino)-hexyl]-4-biphenyl.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate, 2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable oxime sulfonate generators using substituted acetonitrile derivatives include
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyiraino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenl]acetonitrile,
α-[(dodecylbenzenesulfonyloxyimino)-4-methoxyphenyl]-acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluorontethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable bisoxinte sulfonates include
bis(α-(p-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(p-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Also included are modified forms of the foregoing compounds having substituted on their skeleton
2-benzoylploxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarfaonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Among these, the preferred PAGs are sulfonium salts, bissulfonyldiazomethanes, N-sulfonyloxyimides, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid.

The PAG (B) is added to the resist composition in an amount of 0.2 to 2.0 parts, preferably 0.5 to 10 parts by weight per 100 parts by weight of the polymer (A). The PAG may be used alone or in admixture of two or more. The transmittance of the resist film can be controlled by using a PAG having a low transmittance at the exposure wavelength and adjusting the amount of the PAG added.

Component (C) is a carboxylic acid, which is preferably selected from a saturated or unsaturated aliphatic carboxylic acid, alicyclic carboxylic acid, oxy carboxylic acid, alkoxy carboxylic acid, keto carboxylic acid, and aromatic carboxylic acid.

Suitable saturated aliphatic carboxylic acids are mono- or polyfunctional carboxylic acids including formic acid, acetic acid, propionic acid, butyric acid, isobutyric acid, valeric acid, caproic acid, enanthic acid, oxalic acid, malonic acid, succinic acid, glutaric acid, adipic acid, pimelic acid, and suberic acid. Suitable unsaturated aliphatic carboxylic acids include acrylic acid, crotonic acid, isocrotonic acid, 3-butenoic acid, methacrylic acid, 4-pentenoic acid, propionic acid, 2-butynoic acid, maleic acid, and fumaric acid. Typical of the oxy carboxylic acid is oxyacetic acid. Typical of the alkoxy carboxylic acid is methoxyacetic acid. Typical of the keto carboxylic acid is pyruvic acid. Suitable aromatic carboxylic acids include p-hydroxybenzoic acid, o-hydroxybenzoic acid, phthalic acid, terephthalic acid and isophthalic acid.

The carboxylic acids may be used alone or in admixture. Inter alia, dicarboxylic acids are preferred, more preferably saturated aliphatic dicarboxylic acids, and most preferably dicarboxylic acids having a saturated aliphatic alkyl chain. An appropriate amount of carboxylic acid used is 0.001 to 1 part, more preferably 0.002 to 0.5 part by weight per 100 parts by weight of the solids in the resist composition. More than 1 part by weight of the carboxylic acid may adversely affect adhesion.

Component (D) is at least one compound selected from (D-1) a bensotriazole compound and (D-2) an imidazole compound, both defined below.

The benzotriazole compound (D-1) is selected from compounds having the general formulae (1) and (3).

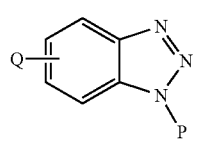
(1)

Herein P is hydrogen, hydroxyl, a substituted or unsubstituted $C_1$-$C_6$ alkyl, substituted or unsubstituted phenyl, substituent group having sulfonic acid or derivative thereof, or Z—Y, wherein Z is a $C_2$-$C_{12}$ alkylene, cycloalkylene or alkylene ether group which may be substituted with carboxyl, Y is hydroxyl, $C_1$-$C_6$ alkoxy, carboxyl, or dialkylamino group in which each alkyl moiety is of $C_1$-$C_6$. Q is hydrogen, halogen, hydroxyl, $C_1$-$C_6$ alkyl, $C_1$-$C_6$ alkoxy, or an organic group of the formula (2):

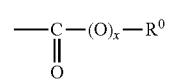
(2)

wherein $R^0$ is hydrogen or $C_1$-$C_{12}$ alkyl, and x is 0 or 1.

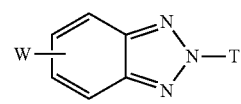
(3)

Herein T is hydrogen, hydroxyl, hydroxyl-substituted or unsubstituted $C_1$-$C_6$ alkyl or hydroxyl- or methyl-substituted or unsubstituted phenyl, W is hydrogen, halogen, hydroxyl, $C_1$-$C_6$ alkyl or $C_1$-$C_6$ alkoxy.

Examples of the benzotriazole compound having formula (1) or (3) include benzotriazole, 1-hydroxybenzotriazole, 1-methylbenzotriazole, 1-hydroxymethylbenzotriazole, 1-ethylbenzotriazole, 1-(1'-hydroxyethyl)benzotriazole, 1-(2'-hydroxyetbyl) benzotriazole, 1-propylbenzotriazole, 1-(1'-hydroxypropyl)benzotriazole, 1-(2'-hydroxypropyl) benzotriazole, 1-(3'-hydroxypropyl)benzotriazole, 4-hydroxy-1H-benzotriazole, 5-methyl-1H-benzotriazole, benzotriazole-5-carboxylic acid, methyl benzotriazole-5-carboxylate, ethyl benzotriazole-5-carboxylate, t-butyl benzotriazole-5-carboxylate, cyclopentylethyl benzotriazole-5-carboxylate, 1H-benzotriazole-4-sulfonic acid, 1H-benzotriazole-1-acetonitrile, 1H-benzotriazole-1-carboxyaldehyde, 2-methyl-2H-benzotriazole, and 2-ethyl-2H-benzotriazole.

The benzotriazole compounds may be used alone or in admixture of two or more. Typically the benzotriazole compound is added in an amount of 0.01 to 10 parts, preferably 0.05 to 5 parts by weight per 100 parts by weight of the polymer (A). Less than 0.01 pbw of the benzotriazole compound may be less effective for preventing the resist pattern from degradation whereas more than 10 pbw may achieve little extra effect despite an increased amount or adversely affect sensitivity and film retention.

The imidazole compound (D-2) is selected from compounds having the general formulae (I-1) to (I-6).

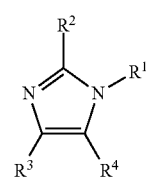
(I-1)

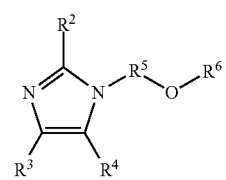
(I-2)

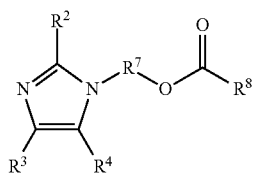

(I-3)

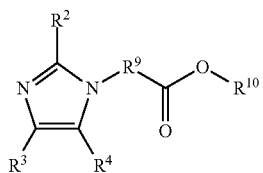

(I-4)

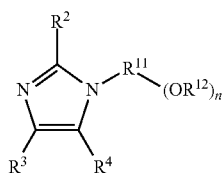

(I-5)

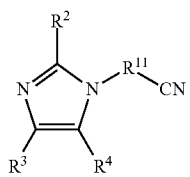

(I-6)

Herein $R^1$ is a straight, branched or cyclic $C_2$-$C_{20}$ alkyl group having a polar functional moiety, the polar functional moiety being at least one moiety selected from among hydroxyl, carbonyl, ester, ether, sulfide, carbonate, cyano and acetal. $R^2$, $R^3$ and $R^4$ are each independently hydrogen, a straight, branched or cyclic $C_1$-$C_{10}$ alkyl, $C_6$-$C_{10}$ aryl or $C_7$-$C_{10}$ aralkyl group. $R^5$, $R^7$, $R^9$ and $R^{13}$ are each independently a straight, branched or cyclic $C_1$-$C_{10}$ alkylene group. $R^6$ and $R^8$ are each independently hydrogen or a $C_1$-$C_{15}$ alkyl group which may contain at least one moiety selected from among hydroxyl, carbonyl, ester, ether, sulfide, carbonate, cyano and acetal. $R^{10}$ is a $C_1$-$C_{15}$ alkyl group which may contain at least one moiety selected from among hydroxyl, carbonyl, ester, ether, sulfide, carbonate, cyano and acetal. $R^{11}$ is a (n+1)-valent, straight, branched or cyclic $C_2$-$C_{10}$ hydrocarbon group. $R^{12}$ is each independently hydrogen or a $C_1$-$C_{15}$ alkyl group which may contain at least one moiety selected from among hydroxyl, carbonyl, ester, ether, sulfide, carbonate, cyano and acetal, or two $R^{12}$ groups may bond together to form a ring, and n is 2, 3, 4 or 5.

Preferred examples of the imidazole compound include imidazole, 2-methylimidazole, 1,2-dimethylimidazole, 2-ethyl-4-methylimidazole, 2-phenyl-imidazole, and 2-phenyl-4-methylimidazole.

In one preferred embodiment, the resist composition further contains (F) a basic compound, with the proviso that the bensotriazole compounds of formulae (1) and (3) are excluded from the basic compound. The basic compound (F) is preferably a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds (F) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, t-butylamine, pentylamine, t-pentylamine, cyclopentylamine, hexylamine, cyclohexylamine, heptylamine, octylamine, nonyl amine, decylamine, dodecylamine, octylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dieyelopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N,N'-tetramethyltetraethylenepentamine.

Examples of suitable mixed amines include dimethyl ethyl amine, methylethyl propylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-diraethyltoluidine), diphenyl (p-tolyl)amine, methyldiphenylamine, triphenylantine phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-t-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hyaroxyphenyl group, and alcoholic nitrogen-containing compounds include 2-hydroxypyridine, aminocresol, 2,4-guinolinediol, 3-indolemethanol hydrate, iaonoethanolamine, dietlianolamine, triethanolamine, N-ethyldiethariolamine, N,N-diethylethanolamine, triisopxopanolamine, 2,2'-iminodiethanol, 2-aminoethanol, 3-amino-1-propanol, 4-amino-1-butanol, 4-(2-hydroxyethyl)morplioline, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidine-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzaiaide. Suitable imide derivatives include phthalimide, succinimide, and maleimide.

In addition, basic compounds of the following general formula (F)-1 may also be included alone or in admixture.

$$N(X)_c(V)_{3-c} \quad \text{(F)-1}$$

In the formula, c is equal to 1, 2 or 3; side chain V is independently hydrogen or a straight, branched or cyclic $C_1$-$C_{20}$ alkyl group which may contain a hydroxyl or ether moiety; and side chain X is independently selected from groups of the following general formulas (F)-2 to (F)-4, and two or three X may bond together to form a ring with the nitrogen atom to which they are attached.

(F)-2

(F)-3

(F)-4

In the formulas, $R^{300}$, $R^{302}$ and $R^{305}$ are independently a straight or branched $C_1$-$C_4$ alkylene group. $R^{301}$ and $R^{304}$ are independently hydrogen, or a straight, branched or cyclic $C_1$-$C_{20}$ alkyl group which may contain at least one hydroxyl, ether or ester moiety or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl, ether or ester moiety or lactone ring.

Illustrative examples of the basic compound having formula (F)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexacxa-1,10-diazabicyclo[8.8.8]hexacosane,
4,7,13,18-tetraoza-1,10-diazabicyclo[8.5.5]eicocane,
1,4,10,13-tetraoxa-7,16-diazabicyclooctadecane,
1-aza-12-crown-4, 1-aza-15-crown-5, 1-aza-18-crown-6,
tris(2-formyloxyehtyl)amine, tris(2-acetoxyethyl)amine,
tris(2-propionyloxeyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-t-butoxycarbonyloxyethyl)amine,
tris[2-(2-oxopropoxy)ethyl]amine,
tris[2-(methoxycarbonylmethyl)oxyethyl]amine,
tris[2-(t-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxysthyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxycarbonyl]ethylamine,
N,N-bis(2-hydroxysthyl)-2-(4-hydroxybutoxycarbonyl)ethylamine,
N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl] amine,
N-(3-acetoxy-1-propyl)-bis[2-(methoxycarbonyl)ethyl] amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

The basic compounds may be used alone or in admixture of two or more. The basic compound (F) is preferably formulated in an amount of 0 to 2 parts, and especially 0.01 to 1 part by weight per 100 parts by weight of the polymer (A). More than 2 parts of the basic compound may result in too low a sensitivity.

If desired, the resist composition may further comprise (G) another polymer, which is a polymer comprising recurring units derived from acrylate or methacrylate represented by the general formula (10) and having a Mw of 1,000 to 500,000.

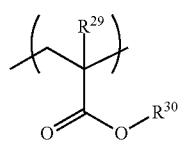

(10)

Herein $R^{29}$ is hydrogen or methyl, and $R^{30}$ is a straight, branched or cyclic $C_1$-$C_{24}$ alkyl group, or a $C_1$-$C_{24}$ monovalent organic group containing oxygen, sulfur or nitrogen.

In formula (10), $R^{29}$ is hydrogen or methyl, which means that the polymer is a polyacrylate or polymethacrylate type polymer. Inter alia, the polyacrylate type polymer of formula (10) wherein $R^{29}$ is hydrogen is preferred for the purpose of improving the crack resistance of the resist composition during the plating step.

$R^{30}$ is preferably a straight, branched or cyclic $C_1$-$C_{12}$ alkyl group, or a $C_1$-$C_{14}$ monovalent organic group containing oxygen, sulfur or nitrogen. Suitable straight, branched or cyclic $C_1$-$C_{12}$ alkyl groups include methyl, ethyl, n-propyl, isopropyl, n-butyl, isobutyl, t-butyl, n-pentyl, n-hexyl, n-heptyl, n-octyl, 2-ethylhexyl, cyclopentyl, cyclohexyl, and cycloheptyl. Suitable $C_1$-$C_{12}$ monovalent organic groups containing oxygen, sulfur or nitrogen include $C_2$-$C_{12}$ alkoxyalkyl groups, $C_1$-$C_{12}$ hydroxyalkyl groups, organic groups of the formula (11):

—($R^{31}$O)$_m$—$R^{32}$ (11)

wherein $R^{31}$ is $C_2$-$C_4$ alkylene, $R^{32}$ is $C_1$-$C_6$ alkyl, and m is an integer of 1 to 6, and organic groups of the formula (12):

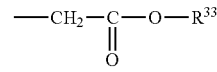

(12)

wherein $R^{33}$ is a straight, branched or cyclic $C_1$-$C_{12}$ alkyl group, a $C_2$-$C_{12}$ alkoxyalkyl group, a $C_1$-$C_{12}$ hydroxyalkyl group, or a $C_3$-$C_{12}$ (poly)alkylene glycol alkyl group. Examples include 2-methoxyethyl, 2-ethoxyethyl, 3-methoxybutyl, 2-hydroxyethyl, 2-hydroxypropyl, 2-hydroxy-1-methylethyl, —(CH$_2$CH$_2$O)$_3$CH$_3$, —(CH$_2$CH$_2$O)$_3$C$_2$H$_3$, —(CH$_2$CH$_2$O)CH$_3$, —(CH$_2$CH$_2$O)C$_2$H$_3$, —(CH$_2$CH$_2$O)$_4$CH$_3$, —(CH(CH$_3$)CH$_2$O)CH$_3$, —(CH(CH$_3$)CH$_2$O)C$_2$H$_3$, and —(CH(CH$_3$)CH$_2$O)-n-C$_4$H$_3$.

The poly(meth)acrylate type polymer of formula (10) should have a Mw of 1,000 to 500,000, preferably 1,000 to 20,000, as measured by GPC versus polystyrene standards using THF as a solvent. A polymer with a Mw in excess of 500,000 is less compatible with the polymer of formula (4) or less soluble in organic solvents. Also scum may be observed after development for patterning, or resolution and sensitivity may foe degraded. A polymer with too low a Mw may fail to provide crack resistance during and after the plating step.

The poly(meth)acrylate type polymer of formula (10) (simply other polymer) is blended with the polymer of formula (4). Preferably 0 to 35 parts, more preferably 5 to 20 parts by weight of the other polymer is blended with 100 parts by weight of the polymer of formula (4). More than 35 parts of the other polymer may invite a risk of scum generation after development.

If desired, (H) an alkali-soluble polymer containing a hydroxyl and/or carboxyl group and having a Mw of 1,000 to 100,000 as measured versus polystyrene standards may be added to the resist composition.

Examples of the polymer soluble in alkaline aqueous solution include, but are not limited to, phenolic resins, polyhydroxystyrene, copolymers of hydroxystyrene with carboxyl-containing vinyl monomer, copolymers of carboxyl-containing monomers such as acrylic acid, methacrylic acid, (meth)acrylate, and maleic acid, copolymers of hydroxystyrene with carboxyl-containing monomers such as acrylic acid, methacrylic acid, (meth)acrylate, and maleic acid, and celluloses soluble in alkaline aqueous solution. Among others, novolak resins, polyhydroxystyrene, copolymers containing acrylic monomers, and alkali-soluble celluloses are preferred because they are readily available and inexpensive.

The alkali-soluble polymer (H) containing a hydroxyl and/or carboxyl group and having a Mw of 1,000 to 100,000 is preferably blended in an amount of 0 to 35 parts, more preferably 5 to 25 parts by weight per 100 parts by weight of the polymer of formula (4). More than 35 parts of the alkali-soluble polymer is undesirable because of a film thickness loss phenomenon that the unexposed region of the resist film is also dissolved upon development.

Since this polymer dissolves in alkaline aqueous solution independent of exposure to radiation and/or actinic light, the polymer may be used when shortening of the development time is desired.

If desired, (I) a surfactant may be added to the resist composition. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan xaonolaurate, polyoxyethylene sorbitan monopalmitate, polyoxyethylene sorbitan monostearate, polyoxyethylene sorbitan trioleate, and polyoxyethylene sorbitan tristearate, and polyether silicone; fiuorochemical surfactants such as EFTOP EF301, EF303 and EF352 ( Tohkem Products Co., Ltd.), Megaface F171, F172 and F173 (DIG Corp.), Fluorad FC-4430, FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acrid Poly flow No. 75 and No. 95 (Kyoeisha Ushi Kagaku Kogyo Co., Ltd.). Inter alia, FC-430 and X-70-093 are preferred. These surfactants may be used alone or in admixture.

The surfactant is preferably formulated in an amount of up to 5 parts, and more preferably up to 2 parts by weight per 100 parts by weight, of the polymer of formula (4).

In the resist composition, other optional components may be added, for example, light absorbing substances for reducing diffuse reflection from the substrate, compounds having 1,2-naphthoquinonediazidesulfonyl group in the molecule, sensitizers, crosslinkers, photobase generators, and acid amplifiers. Such optional components may foe added in conventional amounts as long as they do not compromise the benefits of the invention.

Suitable light absorbing substances are dyes including azo compounds such as 2-benzeneazo-4-methylphenol and 4-hydroxy-4'-dimethylamirioazobenzene, and curcumin.

In the resist composition, (E) an organic solvent may be used for the purpose of uniformly dissolving and mixing various components. Suitable organic solvents include, but are not limited to, butyl acetate, pentyl acetate, cyclohexyl acetate, 3-methoxybutyl acetate, methyl ethyl ketone, methyl pentyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxyfoutanol, N-methylpyrrolldone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramefhylene sulfone. Of these, propylene glycol alkyl ether acetates and alkyl lactates are preferred. The solvents may be used alone or in admixture. The preferred solvent mixture is a combination of a propylene glycol alkyl ether acetate and an alkyl lactate. It is noted that the alkyl, group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- find 1,3- substituted ones, each includes three isomers depending on the combination of substituted positions, which may be used alone or in admixture. It is also noted that the alkyl group of the alkyl lactate is preferably of 1 to 4 carbon atoms, for example, methyl, ethyl and propyl, with methyl and ethyl being especially preferred.

When the propylene glycol alkyl ether acetate or alkyl lactate alone is used as the solvent, it preferably accounts for at least 50% by weight of the entire solvent from the aspects of ease of coating due to an appropriate viscosity and elimination of particles or foreign matter. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 5 to 40% by weight.

In the resist composition, the solvent is preferably used in an amount of 50 to 2,000 parts by weight, especially 100 to 1,000 parts by weight per 100 parts by weight of the polymer of formula (4). The amount of the solvent is not limited thereto as long as the components can be dissolved and mixed uniformly and a coating of predetermined thickness be formed. The resulting solution may be filtered through a filter, if necessary.

Process

When a pattern is formed from the chemically amplified positive resist composition of the invention, any well-known lithography processes may be applied. Generally, the solution-form resist composition is directly coated onto a substrate. Alternatively, a film is preformed from the composition and bonded to a substrate as described below.

In a clean, room at a cleanness class of up to 1,000, the solution-form resist composition is coated on a support film (or parting substrate), using an applicator installed in a zone which is kept at a temperature of 5 to 45° C., preferably 15 to 35° C. and a humidity of 5 to 90%, preferably 10 to 70%. Suitable applicators include a forward roll coater, reverse roll coater, comma coater, die coater, lip coater, gravure coater, dip coater, air knife coater, capillary coater, raising and rising (R&R) coater, blade coater, bar coater, and extrusion molding machine. The solution is coated on a support while the support is preferably fed at a speed of 0.05 to 1,000 m/min, more preferably 0.1 to 500 m/min. After coating of the resist solution, the coated support is passed through an in-line dryer or hot air circulating oven at 40 to 130° C. for 1 to 40 minutes, more preferably at 50 to 120° C. for 2 to 30 minutes, until the organic solvent and any volatiles are removed. By drying in this way, a resist film layer is formed on the support. A resist film layer may also be formed by infrared drying instead of the in-line dryer, to remove the organic solvent. If necessary, a protective film (or another parting substrate) may be press bonded to the resist film layer on a roll laminator, yielding a laminate.

A production line including molding and treating sections for applying the solution-form resist composition onto a support film under appropriate conditions is designed such that the resist film may be continuously formed as a length of resist film layer and taken up as a film roll, which is easy to handle. This is also true to the laminate having the protective film formed on the resist film layer.

From the solution-form resist composition, a resist coating preferably containing more than 0 to 40% by weight, more preferably 10 to 35% by weight of the organic solvent is effectively formed. If the content of organic solvent exceeds 40 wt %, sometimes it is difficult to form a film, and a definite film cannot be secured to the support. It is noted that the remainder other than the organic solvent is low-molecular-weight components originating front the starting components.

Preferably, the resist fills layer has a thickness of 5 to 250 μm, more preferably 10 to 150 μm.

The support film and (optional) protective film, both serving as parting substrate, are not particularly limited as long as the film does not adversely affect the shape of the resist film layer and can be separated from the resist film layer. The film may be a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film, which may be treated with a parting agent.

Among others, PET is preferred as the support film because of appropriate flexibility, mechanical strength and heat resistance. The film may have been subjected to various treatments such as corona treatment and coating of parting agent. Useful films are commercially available, for example, Cerapeel WZ(RX) and Cerapeel BX8 (R) from Toray Advanced Film Co., Ltd., E7302 and E7304 from Toyobo Co., Ltd., Purex G31 and Purex G71T1 from Dupont-Teijin Film Co., Ltd., PET38x1-A3, PETS8x1-V8 and PET3 8x1-X08 from Nippa Corp.

As the protective film, films of PET and polyethylene are preferred because of appropriate flexibility. Commercial available films may be used as well. Useful PET films are as mentioned above, and useful polyethylene films include GF-8 from Tamapoly Co., Ltd. and PE FILM 0 TYPE from Nippa Corp.

The support film and protective film have a thickness of preferably 10 to 100 μm, more preferably 25 to 70 μm, from the viewpoints of stable film formation and anti-curling from the roll state wound around the windup mandrel.

On use, the protective film is peeled from the resist film layer in the laminate constructed as above. The peeling force of the protective film from the resist film layer is typically in a range of 1 to 500 gf/24 mm, when measured by the following method. The test, is carried out according to JIS Z0237 "Testing method of measuring peel adhesion of release liner from pressure-sensitive adhesive tape surface". The testing environment is under standard conditions (temperature 23±1° C., relative humidity 50±5%). The film piece used in the test has a width of 24 mm. The film width should he constant because the peel adhesion varies if the film width varies. Once a film piece of the predetermined width is furnished, measurement is carried out on a tester by peeling the protective film at an angle of 180° and a speed of 5.0±0.2 mm/sec. As to the measurement value, measurement values over the initial 25 mm portion are excluded, and an average of measurement values over the succeeding 50 mm portion is reported as the test data.

The chemically amplified positive resist film thus obtained may be bonded to a substrate using a suitable laminator such as vacuum laminator or roll laminator. The substrate is selected from substrates of Si, $SiO_2$, SiM, SiON, TiN, WSi, BPSG and SOG, metal substrates of Au, Ti, W, Cu, Ni—Fe, Ta, Zn, Co and Pb, and organic antireflective coatings. The bonding step may or may not be followed by heat treatment. When heat treatment is performed, the assembly may be prebaked on a hot plate or in an oven at 60 to 150° C. for 1 to 15 minutes, preferably 80 to 130° C. for 1 to 5 minutes.

Instead of performing into a film as mentioned above, the chemically amplified positive resist composition in solution form may be directly coated onto a substrate. In this embodiment, the resist composition is applied onto a substrate by a suitable coating technique. The substrate is selected from substrates of Si, $SiO_2$, SiN, SiON, TiN, WSi, BPSG and SOG, metal substrates of Au, Ti, W, Cu, Ni—Fe, Ta, Zn, Co and Pb, and organic antireflective coatings. Suitable coating techniques include spin coating, roll coating, flow coating, dip coating, spray coating, and doctor blade coating. The coating is prebaked on a hot plate or in an oven at 60 to 150° C. for 1 to 60 minutes, preferably 80 to 130° C. for 1 to 30 minutes to form a resist film having a desired thickness.

Through a mask having a desired pattern, the resist film is then exposed to radiation selected from UV, deep UV and EB, preferably radiation with a wavelength of at least 300 nm, more preferably 300 to 500 nm. The exposure dose is preferably in the range of about 10 to 5,000 $mJ/cm^2$, more preferably about 50 to 2,000 $mJ/cm^2$. If desired, the film may be baked (PEB) on a hot plate at 60 to 150° C. for 1 to 10 minutes, preferably 80 to 120° C. for 1 to 5 minutes.

Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 60 minutes, preferably 0.5 to 10 minutes by conventional techniques such as dip, puddle or spray development. In this way, a desired resist pattern is formed on the substrate.

At the end of development, the resist pattern should preferably have an aspect ratio of at least 2, more preferably from 2 to 10.

After the development step, electroplating or electroless plating may be carried, out to form a metal plating layer on the resist pattern-bearing substrate. That is, a metal plating pattern is obtained. The plating step may be any of standard electroplating or electroless plating methods to deposit a conductor pattern, after which the resist pattern is removed.

Suitable electroplating or electroless plating methods include electrolytic Cu plating, electroless Cu plating, electrolytic Ni plating, electroless Ni plating, and electrolytic Au plating. Plating may be performed in any well-known plating baths and under standard conditions. The thickness of a plating layer is typically 80 to 100% of the thickness of the resist pattern. For example, a resist pattern of 1 μm thick is formed on a seed layer of Ni—Fe, after which a nickel plating pattern of 0.8 to 1 μm thick is deposited thereon by electrolytic Ni plating.

EXAMPLE

Examples of the invention are given below by way of illustration and not by way of limitation. All parts are by weight (pbw). Mw and Mn are as measured by GPC versus polystyrene standards.

Examples 1 to 11

A resist solution, was prepared by dissolving a base resin, photoacid generator, carboxylic acid, benzotriazole compound, and imidazole compound in a solvent in accordance with the formulation shown in Table 1, and filtering through a membrane filter having a pore size of 1.0 μm. The base resin is selected from Polymers 1 to 5; the photoacid generator is PAG-1 which is PAI-101 by Midori Kagaku Co., Ltd. or PAG-2 which is HT-1CS by San-Apro Co., Ltd.; the carboxylic acid is selected from CA-1 to CA-3; the benzotriazole compound is selected from BTA-1 to BTA-3; and the imidazole compound is 2-ethyl-4-methylimidazole (trade name 2E4MZ from Shikoku Chemicals Corp.). The solvent is a 1:1 solvent mixture of propylene glycol monomethyl ether acetate and cyclopentanone, containing 0.10 pbw of surfactant X-70-093 (Shin-Etsu Chemical Co., Ltd.).

The resist solution was spin coated onto a substrate, which was a 8-inch silicon wafer having copper deposited thereon by sputtering, and soft baked on a hot plate at 120° C. for 300 seconds to form a resist film having a thickness of 50 μm.

Next, using an i-line stepper NSR-2205i11D (Nikon Corp.), the resist film was exposed to i-line through a reticle. This was followed by PEB at 110° C. for 90 seconds, puddle development in a 2.38 wt % tetramethylammonium hydroxide aqueous solution for 300 seconds, pure water rinsing, and drying.

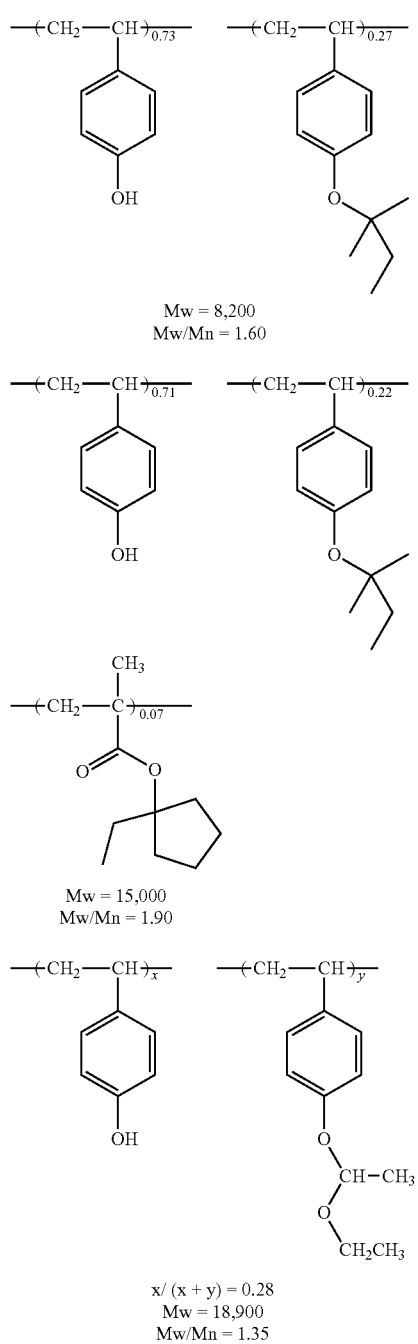
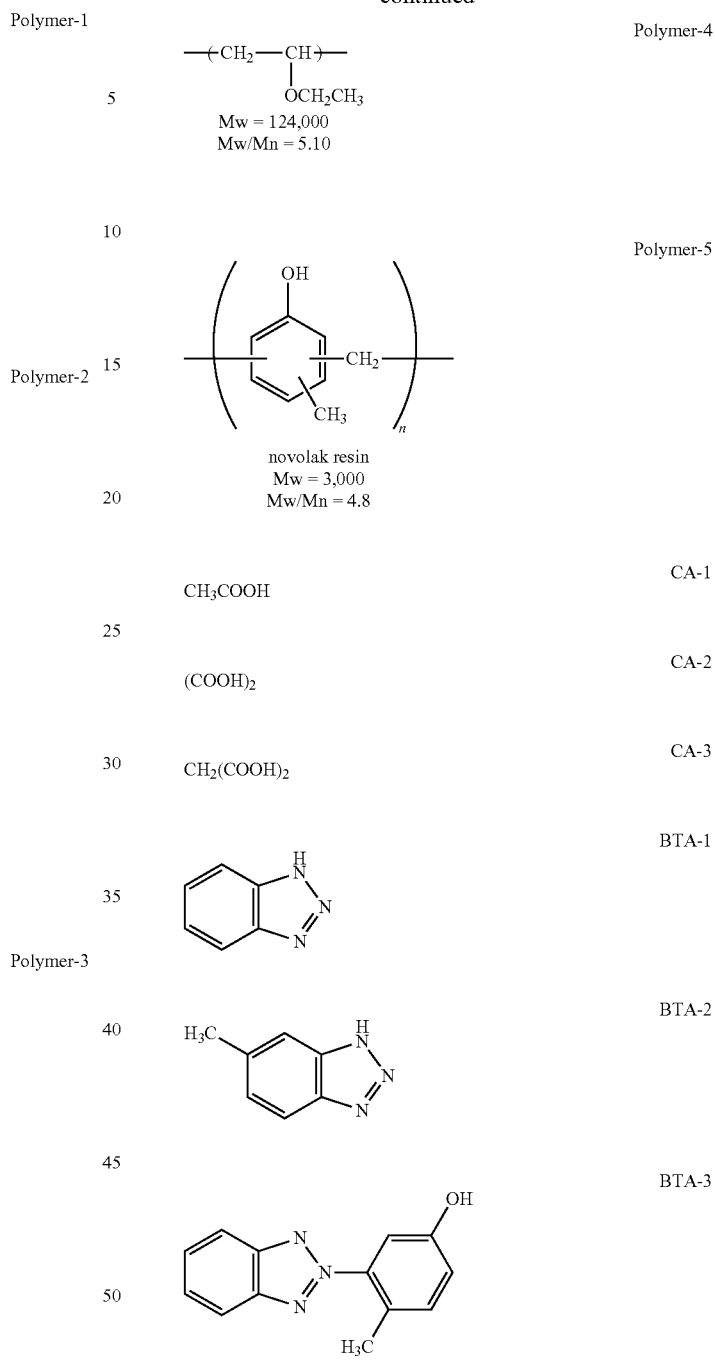
TABLE 1
|  |  | Polymer (pbw) | Photoacid generator (pbw) | Carboxylic acid (pbw) | Benzotriazole or imidazole (pbw) |
|---|---|---|---|---|---|
| Example | 1 | Polymer-1 (100) | PAG-1 (5.0) | CA-1 (0.10) | BTA-1 (0.01) |
|  | 2 | Polymer-2 (100) | PAG-2 (2.0) | CA-2 (0.05) | BTA-1 (0.02) |
|  | 3 | Polymer-3 (100) | PAG-1 (1.5) | CA-2 (0.02) | BTA-2 (0.05) |
|  | 4 | Polymer-3 (100) | PAG-1 (2.0) | CA-3 (0.02) | BTA-3 (0.10) |
|  | 5 | Polymer-4 (15) | PAG-1 (2.0) | CA-3 (0.03) | BTA-3 (0.30) |
|  | 6 | Polymer-2 (80) Polymer-4 (20) | PAG-2 (2.0) | CA-3 (0.02) | BTA-1 (0.10) |
|  | 7 | Polymer-3 (90) Polymer-5 (10) | PAG-2 (5.0) | CA-1 (0.05) | BTA-2 (0.10) |

TABLE 1-continued

|  |  | Polymer (pbw) | Photoacid generator (pbw) | Carboxylic acid (pbw) | Benzotriazole or imidazole (pbw) |
|---|---|---|---|---|---|
|  | 8 | Polymer-2 (90) polymer-5 (10) | PAG-2 (1.0) | CA-2 (0.05) | BTA-2 (0.03) |
|  | 9 | Polymer-1 (80) Polymer-5 (20) | PAG-1 (1.0) PAG-2 (1.5) | CA-2 (0.10) | BTA-3 (0.10) |
|  | 10 | Polymer-1 (80) Polymer-4 (10) Polymer-5 (10) | PAG-2 (3.0) | CA-3 (0.05) | BTA-1 (0.05) |
|  | 11 | Polymer-2 (100) | PAG-2 (2.0) | CA-3 (0.10) | 2E4MZ (0.02) |
| Comparative Example | 1 | Polymer-1 (100) | PAG-1 (3.0) | CA-1 (0.20) | — |
|  | 2 | Polymer-2 (100) | PAG-2 (2.0) | CA-3 (0.05) | — |
|  | 3 | Polymer-3 (100) | PAG-2 (1.5) | CA-2 (0.10) | — |
|  | 4 | Polymer-1 (80) Polymer-4 (20) | PAG-2 (5.0) | — | BTA-1 (0.10) |
|  | 5 | Polymer-2 (90) Polymer-5 (10) | PAG-1 (1.0) | — | BTA-3 (0.03) |
|  | 6 | Polymer-3 (85) Polymer-4 (15) | PAG-1 (3.0) | — | BTA-2 (0.20) |

The resist pattern thus obtained was observed under a scanning electron microscope (S-4700, Hitachi High-Technologies Corp.) to determine an optimum dose, resolution, pattern profile in proximity to substrate, and aspect ratio. The optimum dose is an exposure dose (mJ/cm$^2$) at which a hole pattern with a size of 50 μm is printed from a mask pattern with a size of 50 μm. The resolution is the minimum size of a hole pattern which is resolved at the optimum dose. The pattern profile in proximity to substrate is determined by measuring the distance of footing on one side of a pattern feature which is resolved at the optimum dose. The pattern profile is reported as 0 μm when no footing is observed. The aspect ratio is a ratio (T/W) of resist thickness (T) to pattern width (W). The results are shown in Table 2.

TABLE 2

|  |  | Optimum dose (mJ/cm$^3$) | Resolution (μm) | Pattern profile (μm) | Aspect ratio |
|---|---|---|---|---|---|
| Example | 1 | 300 | 20 | 0 | 2.5 |
|  | 2 | 500 | 15 | 0 | 3.3 |
|  | 3 | 400 | 20 | 0 | 2.5 |
|  | 4 | 600 | 20 | 0 | 2.5 |
|  | 5 | 1000 | 15 | 0 | 3.3 |
|  | 6 | 700 | 15 | 0 | 3.3 |
|  | 7 | 400 | 20 | 0 | 2.5 |
|  | 8 | 600 | 15 | 0 | 3.3 |
|  | 9 | 500 | 15 | 0 | 3.3 |
|  | 10 | 500 | 15 | 0 | 3.3 |
|  | 11 | 900 | 20 | 0 | 2.5 |
| Comparative Example | 1 | 400 | 40 | 10 | 1.3 |
|  | 2 | 500 | 40 | 10 | 1.3 |
|  | 3 | 500 | 30 | 5 | 1.7 |
|  | 4 | 400 | 20 | 5 | 2.5 |
|  | 5 | 700 | 20 | 2 | 2.5 |
|  | 6 | 800 | 30 | 2 | 1.7 |

The resist composition solution of Example 10 was coated onto a PET film by means of an applicator, and dried in a clean oven at 100° C. for 15 minutes to form a chemically amplified positive resist film. It was found that the PE film was covered with the resist film having no bubbles introduced therein.

Example 12

Using a laminator (TEAM-100, Takatori Co., Ltd.), the resist film was bonded to a substrate, which was a 8-inch silicon wafer having copper deposited thereon by sputtering. The subsequent steps were the same as in Example 10. The results are shown in Table 3.

TABLE 3

|  | Optimum dose (mJ/cm$^2$) | Resolution (μm) | Pattern profile (μm) |
|---|---|---|---|
| Example 12 | 400 | 15 | 0 |

Plating Resistance Test

The test followed the formation of resist patterns on substrates in Examples 1 to 12. The surface of the resist pattern-bearing substrate was treated with an oxygen plasma by operating a dry etching system (DEM-451, Nichiden Anelva Co., Ltd.) at 100 W for 30 seconds, to effect ashing. The substrate was immersed in a copper plating bath (Microfab Cu200, Tanaka Precious Metals K.K.), where electroplating of copper was carried out by a constant current flow at 25° C. for 20 minutes, depositing a copper layer of about 20 μm thick. After plating, the surface was washed with flowing deionized water. The resist surface was observed under an optical microscope. The resist film was examined for deformation and cracking by growth stress of plating. With respect to crack resistance, 900 points or crack-sensitive corners on a resist pattern as shown in FIG. 1 were inspected. The number of cracks generated was counted. The sample was rated high crack resistance when the count was less than 20 points among 900 points. The results are shown in Table 4. In FIG. 1, "C" is a plan view of the entire wafer; "B" on the right side is an enlarged, view of pattern features; and "A" designates a crack inspecting area which includes 6×5=30 points for a size of 50 μm within one shot, indicating that on the entire wafer surface (30 shots, shown left), 30×30=900 points were inspected.

TABLE 4

|  |  | Plating resistance |
|---|---|---|
| Example | 1 | good |
|  | 2 | good |
|  | 3 | good |
|  | 4 | good |
|  | 5 | good |
|  | 6 | good |

TABLE 4-continued

| | Plating resistance |
|---|---|
| 7 | good |
| 8 | good |
| 9 | good |
| 10 | good |
| 11 | good |
| 12 | good |

Japanese Patent Application No. 2015-154142 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition consisting of
   (A) a polymer adapted to turn soluble in alkaline aqueous solution under the action of acid,
   (B) a photoacid generator,
   (C) a carboxylic acid selected from the group consisting of formic acid, acetic acid, propionic acid, butyric acid, isobutyric acid, valeric acid, caproic acid, enanthic acid, glutaric acid, adipic acid, pimelic acid, suberic acid, acrylic acid, crotonic acid, isocrotonic acid, 3-butenoic acid, methacrylic acid, 4 pentenoic acid, 2-butynoic acid, fumaric acid, methoxyacetic acid, pyruvic acid, p-hydroxybenzoic acid, o-hydroxybenzoic acid, phthalic acid, terephthalic acid and isophthalic acid, and
   (D) (D-1) a benzotriazole compound, and
   optionally at least one selected from the group consisting of
   (E) an organic solvent,
   (G) a polymer comprising recurring units derived from acrylate or methacrylate represented by the general formula (10) and having a Mw of 1,000 to 500,000,
   (H) an alkali-soluble polymer containing a hydroxyl and/or carboxyl group and having a Mw of 1,000 to 100,000 as measured versus polystyrene standards may be added to the resist composition, and
   (I) a surfactant,
   the benzotriazole compound (D-1) having the general formula (1) or (3):

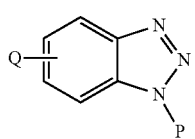
(1)

wherein P is hydrogen, hydroxyl, a substituted or unsubstituted $C_1$-$C_6$ alkyl, substituted or unsubstituted phenyl, substituent group having sulfonic acid or derivative thereof, or —Z—Y, wherein Z is a $C_2$-$C_{12}$ alkylene, cycloalkylene or alkylene ether group which may be substituted with carboxyl, Y is hydroxyl, $C_1$-$C_6$ alkoxy, carboxyl, or dialkylamino group in which each alkyl moiety is of $C_1$-$C_6$, Q is hydrogen, halogen, hydroxyl, $C_1$-$C_6$ alkyl, $C_1$-$C_6$ alkoxy, or an organic group of the formula (2):

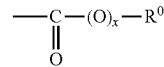
(2)

wherein $R^0$ is hydrogen or $C_1$-$C_{12}$ alkyl, x is 0 or 1,

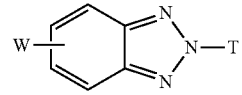
(3)

wherein T is hydrogen, hydroxyl, hydroxyl-substituted or unsubstituted $C_1$-$C_6$ alkyl or hydroxyl- or methyl-substituted or unsubstituted phenyl, W is hydrogen, halogen, hydroxyl, $C_1$-$C_6$ alkyl or $C_1$-$C_6$ alkoxy,

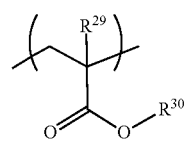
(10)

wherein $R^{29}$ is hydrogen or methyl, and $R^{30}$ is a straight, branched or cyclic $C_1$-$C_{24}$ alkyl group, or a $C_1$-$C_{24}$ monovalent organic group containing oxygen, sulfur or nitrogen.

2. The resist composition of claim 1 wherein the polymer (A) comprises a polymer comprising recurring units represented by the general formula (4) and having a weight average molecular weight of 1,000 to 500,000,

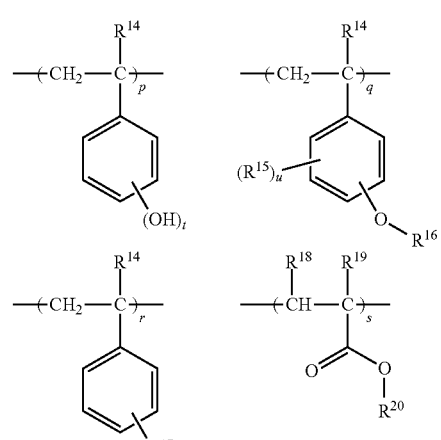
(4)

wherein $R^{14}$ is each independently hydrogen, hydroxyl, straight alkyl, branched alkyl, halogen or trifluoromethyl, $R^{15}$ is each independently hydrogen, hydroxyl, halogen or trifluoromethyl, $R^{16}$ is $C_4$-$C_{12}$ tertiary alkyl, $R^{17}$ is hydrogen, optionally substituted alkyl, optionally substituted alkoxy, —C(CF$_3$)$_2$—OH, trialkylsiloxy group in which each alkyl moiety is of $C_1$-$C_6$, $C_4$-$C_{20}$ oxoalkoxy, tetrahydropyranyloxy, or tetrahydrofuranyloxy group, $R^{18}$ is hydrogen or methyl, $R^{19}$ is hydrogen, methyl, alkoxycarbonyl, cyano, halogen or trifluoromethyl, $R^{20}$ is a substituted or unsubstituted, straight or branched $C_4$-$C_{30}$ alkyl group or substituted or unsubstituted cycloalkyl group, u is an integer of 0 to 4, t is an integer of 0 to 5, p, r and s each are 0 or a positive number, q is a positive number, p+q+r+s=1.

3. The resist composition of claim 1, further comprising (E) an organic solvent.

4. A dry film comprising a support film and a layer formed thereon from the chemically amplified positive resist composition of claim 1.

5. A pattern forming process comprising the steps of forming a coating of the chemically amplified positive resist composition of claim 1 or the layer of the chemically amplified positive resist composition of claim 4 on a substrate, optionally prebaking, exposing the coating or layer to radiation or electron beam through a photomask, optionally baking, and developing in a developer.

6. The process of claim 5 wherein the step of exposing the coating or layer to radiation uses radiation with a wavelength of longer than 300 nm.

7. The process of claim 5, further comprising the step of forming a metal plating on the substrate by electroplating or electroless plating, subsequent to the developing step.

8. A chemically amplified positive resist composition consisting of
(A) a polymer adapted to turn soluble in alkaline aqueous solution under the action of acid,
(B) a photoacid generator,
(C) a carboxylic acid selected from the group consisting of formic acid, acetic acid, propionic acid, butyric acid, isobutyric acid, valeric acid, caproic acid, enanthic acid, glutaric acid, adipic acid, pimelic acid, suberic acid, acrylic acid, crotonic acid, isocrotonic acid, 3-butenoic acid, methacrylic acid, 4 pentenoic acid, 2-butynoic acid, fumaric acid, methoxyacetic acid, pyruvic acid, p-hydroxybenzoic acid, o-hydroxybenzoic acid, phthalic acid, terephthalic acid and isophthalic acid, and
(D) (D-2) an imidazole compound, and
optionally at least one selected from the group consisting of
(E) an organic solvent,
(G) a polymer comprising recurring units derived from acrylate or methacrylate represented by the general formula (10) and having a Mw of 1,000 to 500,000,
(H) an alkali-soluble polymer containing a hydroxyl and/or carboxyl group and having a Mw of 1,000 to 100,000 as measured versus polystyrene standards may be added to the resist composition, and
(I) a surfactant,
the imidazole compound (D-2) having any one of the general formulae (I-1) to (I-6):

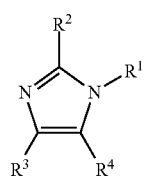

(I-1)

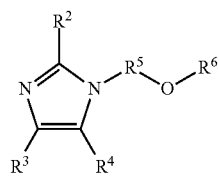

(I-2)

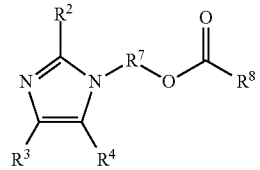

(I-3)

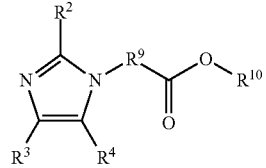

(I-4)

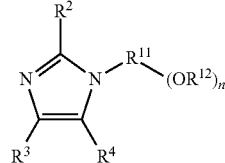

(I-5)

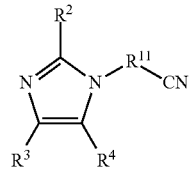

(I-6)

wherein $R^1$ is a straight, branched or cyclic $C_2$-$C_{20}$ alkyl group having a polar functional moiety, the polar functional moiety being at least one moiety selected from the group consisting of hydroxyl, carbonyl, ester, ether, sulfide, carbonate, cyano and acetal,
$R^2$, $R^3$ and $R^4$ are each independently hydrogen, a straight, branched or cyclic $C_1$-$C_{10}$ alkyl, $C_6$-$C_{10}$ aryl or $C_7$-$C_{10}$ aralkyl group,
$R^5$, $R^7$, $R^9$ and $R^{13}$ are each independently a straight, branched or cyclic $C_1$-$C_{10}$ alkylene group,
$R^6$ and $R^8$ are each independently hydrogen or a $C_1$-$C_{15}$ alkyl group which may contain at least one moiety selected from the group consisting of hydroxyl, carbonyl, ester, ether, sulfide, carbonate, cyano and acetal,
$R^{10}$ is a $C_1$-$C_{15}$ alkyl group which may contain at least one moiety selected from the group consisting of hydroxyl, carbonyl, ester, ether, sulfide, carbonate, cyano and acetal,
$R^{11}$ is a (n+1)-valent, straight, branched or cyclic $C_2$-$C_{10}$ hydrocarbon group, $R^{12}$ is each independently hydrogen or a $C_1$-$C_{15}$ alkyl group which may contain at least one moiety selected from the group consisting of hydroxyl, carbonyl, ester, ether, sulfide, carbonate, cyano and acetal, or two groups $R^{12}$ may bond together to form a ring, and n is 2, 3, 4 or 5,

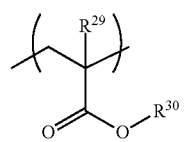

(10)

wherein $R^{29}$ is hydrogen or methyl, and $R^{30}$ is a straight, branched or cyclic $C_1$-$C_{24}$ alkyl group, or a $C_1$-$C_{24}$ monovalent organic group containing oxygen, sulfur or nitrogen.

9. The chemically amplified positive resist composition of claim 8 wherein the polymer (A) comprises a polymer comprising recurring units represented by the general formula (4) and having a weight average molecular weight of 1,000 to 500,000,

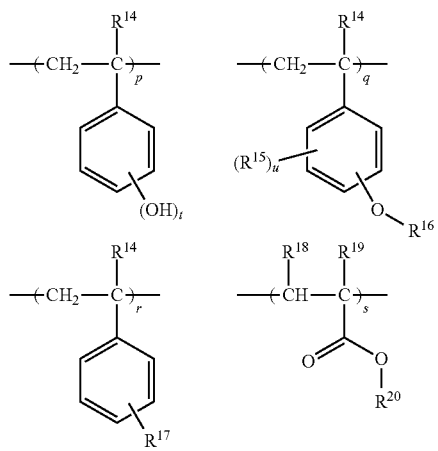

(4)

wherein $R^{14}$ is each independently hydrogen, hydroxyl, straight alkyl, branched alkyl, halogen or trifluoromethyl, $R^{15}$ is each independently hydrogen, hydroxyl, halogen or trifluoromethyl, $R^{16}$ is $C_4$-$C_{12}$ tertiary alkyl, $R^7$ is hydrogen, optionally substituted alkyl, optionally substituted alkoxy, —$C(CF_3)_2$—OH, trialkylsiloxy group in which each alkyl moiety is of $C_1$-$C_6$, $C_4$-$C_{20}$ oxoalkoxy, tetrahydropyranyloxy, or tetrahydrofuranyloxy group, $R^{18}$ is hydrogen or methyl, $R^{19}$ is hydrogen, methyl, alkoxycarbonyl, cyano, halogen or trifluoromethyl, $R°$ is a substituted or unsubstituted, straight or branched $C_4$-$C_{30}$ alkyl group or substituted or unsubstituted cycloalkyl group, u is an integer of 0 to 4, t is an integer of 0 to 5, p, r and s each are 0 or a positive number, q is a positive number, p+q+r+s=1.

10. A chemically amplified positive resist composition comprising (A) a polymer adapted to turn soluble in alkaline aqueous solution under the action of acid, (B) a photoacid generator, (C) a carboxylic acid selected from the group consisting of formic acid, acetic acid, propionic acid, butyric acid, isobutyric acid, valeric acid, caproic acid, enanthic acid, glutaric acid, adipic acid, pimelic acid, suberic acid, acrylic acid, crotonic acid, isocrotonic acid, 3-butenoic acid, methacrylic acid, 4 pentenoic acid, 2-butynoic acid, fumaric acid, methoxyacetic acid, pyruvic acid, p-hydroxybenzoic acid, o-hydroxybenzoic acid, phthalic acid, terephthalic acid and isophthalic acid, and (D) an imidazole compound selected from the group consisting of 1,2-dimethylimidazole, 2 ethyl 4-methylimidazole, and 2-phenylimidazole.

11. The chemically amplified positive resist composition of claim 10 wherein the polymer (A) comprises a polymer comprising recurring units represented by the general formula (4) and having a weight average molecular weight of 1,000 to 500,000,

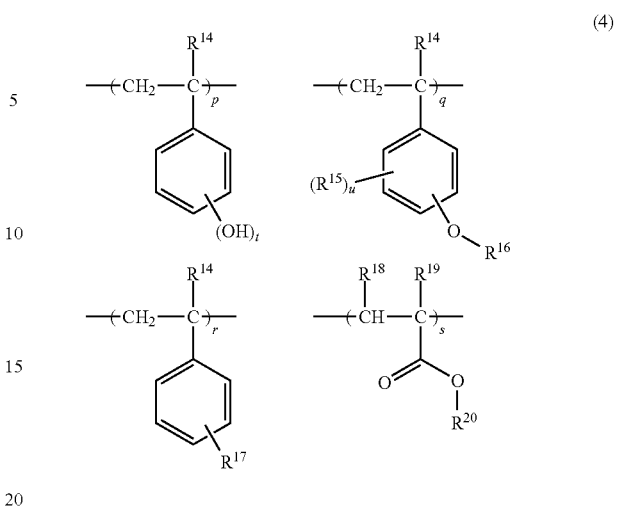

(4)

wherein $R^{14}$ is each independently hydrogen, hydroxyl, straight alkyl, branched alkyl, halogen or trifluoromethyl, $R^{15}$ is each independently hydrogen, hydroxyl, halogen or trifluoromethyl, $R^{16}$ is $C_4$-$C_{12}$ tertiary alkyl, $R^7$ is hydrogen, optionally substituted alkyl, optionally substituted alkoxy, —$C(CF_3)_2$—OH, trialkylsiloxy group in which each alkyl moiety is of $C_1$-$C_6$, $C_4$-$C_{20}$ oxoalkoxy, tetrahydropyranyloxy, or tetrahydrofuranyloxy group, $R^{18}$ is hydrogen or methyl, $R^{19}$ is hydrogen, methyl, alkoxycarbonyl, cyano, halogen or trifluoromethyl, $R^{20}$ is a substituted or unsubstituted, straight or branched $C_4$-$C_{30}$ alkyl group or substituted or unsubstituted cycloalkyl group, u is an integer of 0 to 4, t is an integer of 0 to 5, p, r and s each are 0 or a positive number, q is a positive number, p+q+r+s=1.

12. A chemically amplified positive resist composition consisting of (A) a polymer adapted to turn soluble in alkaline aqueous solution under the action of acid, (B) a photoacid generator, (C) a carboxylic acid selected from the group consisting of formic acid, acetic acid, propionic acid, butyric acid, isobutyric acid, valeric acid, caproic acid, enanthic acid, glutaric acid, adipic acid, pimelic acid, suberic acid, acrylic acid, crotonic acid, isocrotonic acid, 3-butenoic acid, methacrylic acid, 4 pentenoic acid, 2-butynoic acid, fumaric acid, methoxyacetic acid, pyruvic acid, p-hydroxybenzoic acid, o-hydroxybenzoic acid, phthalic acid, terephthalic acid and isophthalic acid, and (D) an imidazole compound selected from the group consisting of imidazole, 2-methylimidazole, 1,2-dimethylimidazole, 2 ethyl 4-methylimidazole, 2-phenylimidazole, and 2 phenyl 4 methylimidazole, and optionally at least one selected from the group consisting of (E) an organic solvent, (G) a polymer comprising recurring units derived from acrylate or methacrylate represented by the general formula (10) and having a Mw of 1,000 to 500,000, (H) an alkali-soluble polymer containing a hydroxyl and/or carboxyl group and having a Mw of 1,000 to 100,000 as measured versus polystyrene standards may be added to the resist composition, and (I) a surfactant,

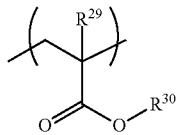
(10)

wherein $R^{29}$ is hydrogen or methyl, and $R^{30}$ is a straight, branched or cyclic $C_1$-$C_{24}$ alkyl group, or a $C_1$-$C_{24}$ monovalent organic group containing oxygen, sulfur or nitrogen.

13. The chemically amplified positive resist composition of claim 12 wherein the polymer (A) comprises a polymer comprising recurring units represented by the general formula (4) and having a weight average molecular weight of 1,000 to 500,000,

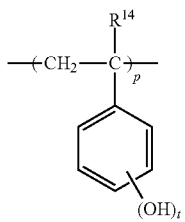 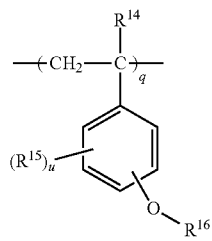
(4)

-continued

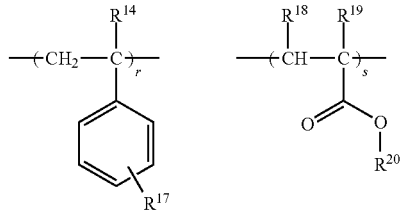

wherein $R^{14}$ is each independently hydrogen, hydroxyl, straight alkyl, branched alkyl, halogen or trifluoromethyl, $R^{15}$ is each independently hydrogen, hydroxyl, halogen or trifluoromethyl, $R^{16}$ is $C_4$-$C_{12}$ tertiary alkyl, $R^{17}$ is hydrogen, optionally substituted alkyl, optionally substituted alkoxy, —$C(CF_3)_2$—OH, trialkylsiloxy group in which each alkyl moiety is of $C_1$-$C_6$, $C_4$-$C_{20}$ oxoalkoxy, tetrahydropyranyloxy, or tetrahydrofuranyloxy group, $R^{18}$ is hydrogen or methyl, $R^{19}$ is hydrogen, methyl, alkoxycarbonyl, cyano, halogen or trifluoromethyl, $R^{20}$ is a substituted or unsubstituted, straight or branched $C_4$-$C_{30}$ alkyl group or substituted or unsubstituted cycloalkyl group, u is an integer of 0 to 4, t is an integer of 0 to 5, p, r and s each are 0 or a positive number, q is a positive number, p+q+r+s=1.

* * * * *